United States Patent [19]

Crosby

[11] Patent Number: 4,571,501
[45] Date of Patent: Feb. 18, 1986

[54] ELECTRONIC CONTROL CIRCUIT

[75] Inventor: Robert J. Crosby, Wickliffe, Ohio

[73] Assignee: Acme-Cleveland Corporation, Pepper Pike, Ohio

[21] Appl. No.: 541,131

[22] Filed: Oct. 12, 1983

[51] Int. Cl.$^4$ .................. H03K 17/04; H03K 17/10; H03K 17/72; H03K 17/60
[52] U.S. Cl. .................. 307/252 R; 307/252 A; 307/252 J; 307/255; 307/305
[58] Field of Search .......... 307/252 R, 252 A, 252 C, 307/252 H, 252 J, 252 N, 305, 297, 288, 255; 357/38

[56] References Cited

U.S. PATENT DOCUMENTS

| | | |
|---|---|---|
| 3,303,360 | 2/1967 | Gentry . |
| 3,891,866 | 6/1975 | Okuhara et al. . |
| 3,902,079 | 8/1975 | Ahmed . |
| 4,039,865 | 8/1977 | Ohhinata et al. . |
| 4,041,332 | 8/1977 | Ohhinata et al. . |
| 4,071,779 | 1/1978 | Kawanami et al. . |
| 4,107,552 | 8/1978 | Akamatsu . |
| 4,112,315 | 9/1978 | Ohhinata . |
| 4,125,787 | 11/1978 | Ohhinata et al. . |
| 4,160,920 | 7/1979 | Courier de Mere . |
| 4,176,288 | 11/1979 | Komatsu et al. . |
| 4,213,066 | 7/1980 | Rogers .................. 307/252 C |
| 4,213,067 | 7/1980 | Spellman et al. .......... 307/252 C |
| 4,295,059 | 10/1981 | Steigerwald . |

OTHER PUBLICATIONS

General Electric SCR Manual 1964 Third Edition, pp. 4, 5, 10 and 11.

Primary Examiner—John Zazworsky
Attorney, Agent, or Firm—Pearne, Gordon, Sessions, McCoy, Granger & Tilberry

[57] ABSTRACT

A three or four-terminal electronic control circuit utilizes a thyristor and a transistor connected in their regenerative circuit or, alternatively, three transistors interconnected in a regenerative circuit. The thyristor is connected to operate in a remote base mode as a low gain PNP transistor, together with a bipolar NPN transistor. The thyristor and transistor are connected in a regenerative circuit which results in very high gain, low input current, with low cost and complete control for ON and OFF, and even intermediate range conditions due to direct access to the base of the NPN transistor. A switch may be connected to the base of the NPN transistor to control the current thereinto, and when current flows into this base, then the transistor and thyristor are connected toward regenerative conduction. When the base current is terminated by the switch, then the circuit degenerates toward non-conduction. By maintaining the potential of the control terminal at a constant voltage, then the regenerative and degenerative modes may be held in balance and a linear mode of operation may be obtained, e.g., in a voltage regulator circuit. The foregoing abstract is merely a resume of one general application, is not a complete discussion of all principles of operation or applications, and is not to be construed as a limitation on the scope of the claimed subject matter.

17 Claims, 6 Drawing Figures

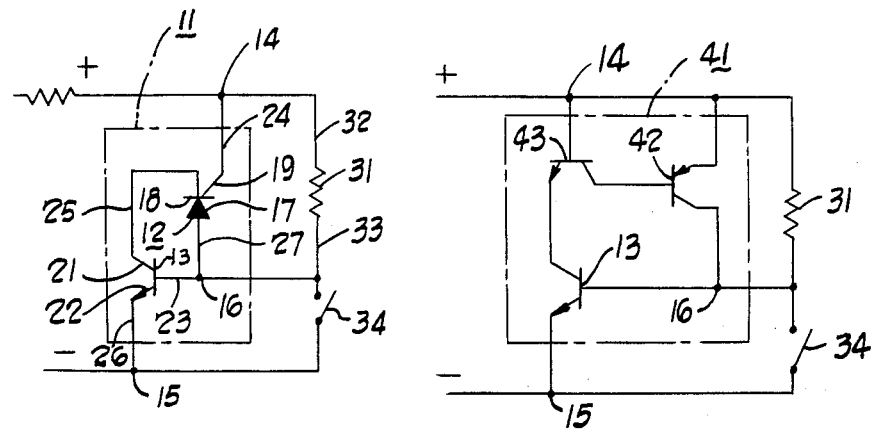
Fig. 1
Fig. 3
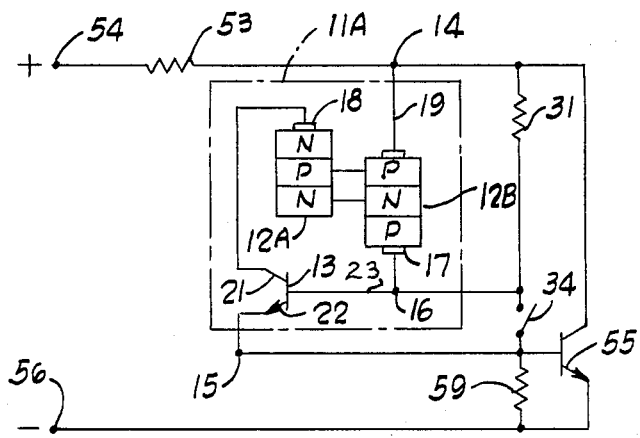
Fig. 2
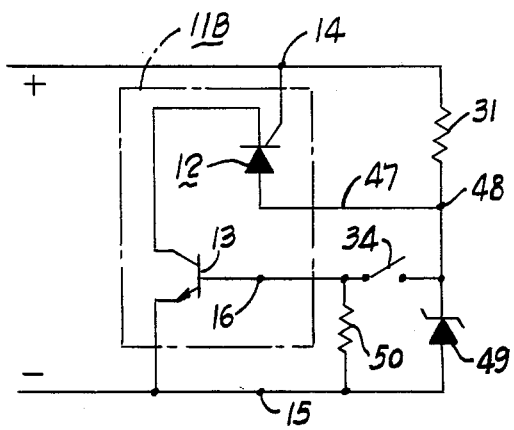
Fig. 4

ELECTRONIC CONTROL CIRCUIT

BACKGROUND OF THE INVENTION

The present invention relates in general to control circuits which require high gain, low saturation voltage, low holding current, high voltage and low leakage in the OFF condition, and fast response time.

The two most commonly used solid-state control devices are the SCR or thyristor, and the power transistor. The thyristor is a high gain, high current and high voltage control device, but it is difficult and slow to turn off. The typical turn-off of a thyristor is to allow the load current to go to zero, or to use a commutating circuit to starve the thyristor anode of current. The power transistor is easy to turn off at some speeds, but requires a large drive current to saturate. The drive current is usually supplied by a Darlington drive transistor which reduces the control current to the base, but raises the voltage across both transistors and slows down the control effected by such transistors. This system can be pulled out of saturation by a surge current of the load which exceeds the drive capability of the transistors. Also, high voltage, high gain transistors are expensive compared to high voltage, low gain transistors and thyristors. The use of the thyristor as a remote base PNP transistor is described in the General Electric SCR manual, Third Edition, 1964, pp. 10–11. Using an SCR in this mode makes it act as a high voltage, low gain PNP transistor. The gate becomes the emitter, the cathode becomes the base, and the anode becomes the collector. This configuration has been known for about 20 years, but has been little used.

The two-transistor analogy of the PNP structure of a thyristor is also described in this Third Edition of the General Electric SCR manual, at page 5. This shows that the PNPN structure may be visualized as consisting of two transistors, a PNP and an NPN, interconnected to form a regenerative feedback pair. That regenerative feedback pair of two opposite types of transistors has been recognized as a latch circuit, e.g., in U.S. Pat. No. 3,902,079, issued Aug. 26, 1975 to Adel A. Ahmed. This PNPN structure is also used in a gate turn-off device. However, in both the thyristor and gate turn-off device, the device will not turn off by merely returning the voltage of the gate to the voltage of the cathode, but the gate must be driven negative relative to the cathode. In the aforementioned patent, the two transistors are disclosed as being of the same size and current handling capability, and are intended to be used in a low power level logic circuit. That patent states that the turn-off may be achieved by removing the operating voltage from the circuit, or by interrupting the base current flow to either transistor.

The problem to be solved, therefore, is how to achieve a simple control circuit which will operate on a wide range of operating voltages, will have high gain, low saturation voltage, low holding current, low initiation current, and fast response time. Also, a circuit is desired which may be operated in the saturated mode and be easily turned on and easily turned off, or which may be operated in the linear control mode in an intermediate range between regenerative conduction and degenerative non-conduction.

SUMMARY OF THE INVENTION

This problem is solved by an electronic control circuit comprising in combination, first and second terminals adapted to be connected respectively to positive and negative DC source terminals, a control terminal on said control circuit, an NPN transistor having collector, emitter, and base electrodes, semiconductor means including at least one structure having a first series of NPN conductivity regions and a second series of PNP conductivity regions, said P conductivity region of said first series being directly connected to said first-mentioned P conductivity region in said second series and connected to said first terminal, said second-mentioned N conductivity region in said first series being directly connected to said N conductivity region in said second series, said first-mentioned N conductivity region in said first series being connected to said collector, said second-mentioned P conductivity region in said second series being adapted to be connected to said base, means connecting said emitter to said second terminal, and means connecting said control terminal to said base to control the current thereinto.

This problem is further solved by an electronic control circuit comprising in combination, first and second terminals adapted to be connected respectively to voltage source terminals, a thyristor having anode, cathode, and gate electrodes, an NPN transistor having collector, emitter, and base electrodes, means connecting said gate to said first terminal, means connecting said emitter to said second terminal, means connecting said cathode to said collector, means connecting said anode to said base to form a regenerative circuit of said thyristor and transistor, a control terminal, and means connecting said control terminal to said regenerative circuit whereby with current flow through said control terminal, said transistor and thyristor are regeneratively brought toward conduction and whereby upon cessation of current flow through said control terminal, said transistor and thyristor are degeneratively brought toward non-conduction.

Accordingly, an object of the invention is to provide an electronic control circuit with high gain, high current, high voltage, high switching speed both ON and OFF, high noise immunity, low holding current, and low cost.

Another object of the invention is to provide an electronic control circuit utilizing a thyristor and a transistor to take advantage of the large current carrying capacity of the thyristor compared to its low cost.

Another object of the invention is to provide an electronic control circuit with three transistors connected in a regenerative circuit to be controlled for rapid turn-on and rapid turn-off.

The invention features a thyristor connected in a remote base mode as a PNP transistor and combined with an NPN transistor. Injecting current into the base of the NPN transistor causes the collector thereof to supply base current to the PNP transistor, causing that transistor to conduct, providing additional base drive for the NPN transistor and, hence, regeneration through the collector of the PNP transistor. If no further control is added to the base of the NPN transistor, then the regenerative circuit will go into full saturation as long as the loop gain $hfe_1 \times hfe_2$ is greater than 1. This control circuit will remain saturated until the collector current goes to zero or the base drive to the NPN transistor is removed, at which time the control circuit will turn off. For linear region operation, control must be maintained on the base of the NPN transistor.

The following features are possible with this control circuit: (1) sensitive base control, very small currents of from 50 nanoamperes to 5 microamperes, dependent upon device selection, can drive the control circuit to saturation; (2) the control circuit can operate in saturated or linear mode; (3) the very high gain is realizable in either the linear or saturated modes; (4) high noise immunity results because the gain of the thyristor is very low; (5) saturation voltage is approximately equal to one junction drop; (6) high voltage up to hundreds of volts operation is possible because of using a high voltage thyristor for a high voltage, low gain PNP transistor; (7) absolute control is maintained by the use of two separate semiconductors and complete control of the base of the NPN transistor is possible; (8) low holding current, e.g., 60 microamperes, is possible; (9) operation on alternating voltage is possible by adding a bridge rectifier; (10) fast turn-on and turn-off are possible because the circuit both regenerates and degenerates; and (11) the control circuit stays saturated during surge currents because of regeneration and the regenerative circuit can supply the required base drive for the NPN transistor.

Other objects and a fuller understanding of the invention may be had by referring to the following description and claims, taken in conjunction with the accompanying drawing.

BRIEF DESCRIPTION OF THE DRAWINGS

FIG. 1 is a schematic diagram of an electronic control circuit embodying the invention;

FIG. 2 is a schematic diagram of a modified circuit embodying the invention;

FIG. 3 is a schematic diagram of a further modification;

FIG. 4 is a schematic diagram of a still further modification;

DESCRIPTION OF THE PREFERRED EMBODIMENTS

Figure 5:
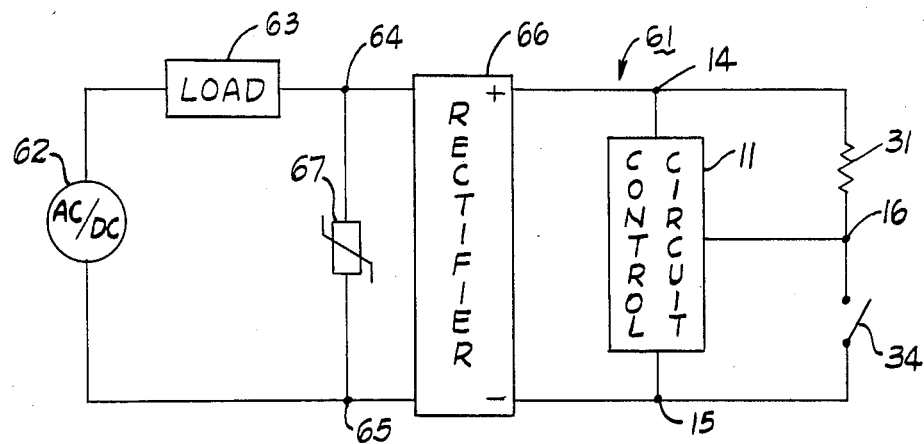
FIG. 5 is a schematic diagram of a complete circuit for a load embodying the present invention.

FIG. 1 illustrates an electronic control circuit 11 which includes an SCR or thyristor 12 and a bipolar transistor, more specifically an NPN transistor 13. The control circuit 11 is adapted to be used with first and second voltage source terminals 14 and 15, which are positive and negative terminals of a DC source. A control terminal 16 is adapted to be connected to the control circuit 11. The thyristor 12 has an anode 17, a cathode 18, and a gate electrode 19, and the NPN transistor 13 has a collector 21, emitted 22, and base electrodes 23. Means is provided, shown as a conductor 24, to connect the gate 19 to the first terminal 14. Means is provided, shown as a conductor 25, to connect the cathode 18 to the collector 21. Means is provided, shown as a conductor 26, to connect the emitter 22 to the second terminal 15, although this may be a diode, if needed for extra voltage drop to balance a voltage drop of a transistor used as a control element on control terminal 16, and means is provided, shown as a conductor 27, to connect the anode 17 to the base 23 and to the control terminal 16. Completion of this latter connection provides a regenerative circuit for the thyristor 12 and transistor 13.

The electronic control circuit 11 may be utilized in either a saturated mode or a linear control mode. In either case, means is provided to establish a positive bias on the control terminal 16 relative to the second terminal 15. In FIG. 1, this bias means is shown as a resistor 31 connected by a conductor 32 to a positive voltage source, e.g., the first terminal 14. The other end of the resistor 31 is connected to the control terminal 16 by a conductor 33. The circuit of FIG. 1 shows the electronic control circuit 11 as one adapted for the saturated mode; to this end a switch 34 is adapted to be connected to the control terminal 16, and in FIG. 1, it is connected between the control terminal 16 and the second terminal 15. This switch 34 may be a mechanical contact type, a reed switch, a transistor, a thyristor or other type of switch. With this switch 34 closed, the base current for the transistor 13 through the resistor 31 is shunted through this switch 34 and away from the transistor 13. The resistor 31 may be a high resistance value, e.g., 1 megohm, because the high gain resulting from regeneration of transistor 13 and thyristor 12 requires only a small base drive current into the base of transistor 13 to initiate regeneration which will then supply base drive from thyristor 12 to transistor 13. Therefore, the closed switch 34 will not waste much power by shunting this base drive current. The thyristor 12 is connected in the remote base mode wherein the gate 19 is the emitter of a PNP transistor, the anode 17 is the collector of this transistor, and the cathode 18 is the base of this transistor.

FIG. 2 better illustrates this circuit connection, wherein the electronic control circuit 11A shows the equivalent circuit for the thyristor 12 as the transistors 12A and 12B, which are shown as NPN and PNP transistors interconnected by direct connections at the second-mentioned P regions and at the first-mentioned N region in transistor 12A to the N region in transistor 12B. The first-mentioned P region of transistor 12B is the gate of the thyristor and acts as the emitter of the PNP transistor. The third-mentioned P region acts as the anode of the thyristor or the collector of this particular PNP transistor. The first-mentioned N region of the NPN transistor 12A acts as the cathode of the thyristor or the base of that NPN transistor. Other circuit components in the circuit of FIG. 2 are the equivalent of those in FIG. 1 and bear the same reference numeral. The remote base configuration is one wherein the PNPN structure of the thyristor is not normally biased to regenerate in and of itself, and hence the bistable action is eliminated. The thyristor in the connection of FIG. 2 helps explain the action of the circuit of FIG. 1. Assume first that the switch 34 is closed, then the base drive for the transistor 13 is shunted away from the base emitter so that this transistor 13 is non-conducting. However, when the switch 34 is opened, then the base 23 is biased positively to turn on the transistor 13. This makes the collector 21 close to the negative potential of terminal 15, and hence the PN junction in the transistor 12A is biased to turn on. The conduction of the NPN transistor 12A establishes the N region of the PNP transistor 12B at close to the negative potential of the second terminal 15. This makes the upper PN junction of the transistor 12B conduct to turn on this transistor 12B so that current flows from the first terminal 14 down to the control terminal 16 through this transistor 12B. Such action enchances the turn-on of the transistor 13 and the entire control circuit 11A regenerates as a regenerative circuit to quickly turn on the thyristor 12 as well as the transistor 13.

FIG. 3 illustrates a discrete version of an electronic control circuit 41, the thyristor 12 is replaced by a PNP transistor 42 and an NPN transistor 43. The emitter of the PNP transistor is connected to the first terminal 14, as is the base of the NPN transistor 43. The collector of the PNP transistor 42 is connected to the control terminal 16 and to the base of the NPN transistor 13, with the base of the transistor 42 connected to the collector of the transistor 43. The emitter of transistor 43 is connected to the collector of transistor 13.

The operation of the control circuit 41 is substantially the same as the operation of the circuits of FIGS. 1 and 2. With the switch 34 closed, there is no base drive to the transistor 13, so it is nonconducting. Upon opening of the switch 34, this transistor 13 conducts, establishing turn-on of the transistor 43, and this in turn turns on transistor 42. The turn-on of this transistor supplies regenerative action by increased base current to the transistor 13, so that this loop of three transistors regenerates quickly into conduction in a saturated mode. In both cases of FIGS. 1 and 3, it has been found that the turn-on of the device is very rapid, i.e., less than 1 microsecond is required for the regenerative action to establish saturated conduction of the thyristor and transistor of FIG. 1 or of the three transistors of FIG. 3. Also in both cases, when the switch 34 is closed, base current to the transistor 13 is shunted away from this transistor, and hence this transistor is turned off. Turn-off of transistor 13 turns off transistor 43 in FIG. 3, which turns off transistor 42. In the case of FIG. 1, the turn-off of transistor 13 turns off the thyristor 12. Thus, the circuit loop rapidly degenerates to the OFF state. This turn-off requires less than 1 microsecond, which is in contrast to the generally fastest thyristors on the market, which have a turn-off time of about 5 to 10 microseconds, or perhaps 40-50 microseconds is a more typical turn-off time where commutated off. Also, in contrast to a thyristor, merely removing the gate signal on a thyristor will not turn it off, whereas, removing the base drive to transistor 13 does turn off the control circuit 11 or 41 because it is rapidly degenerated toward the non-conductive state. When the switch 34 closes, the current through this switch is initially, e.g., for a microsecond, the base current for the transistor 13 which had been required for saturation, and this base current decays rapidly to a small leakage current. The voltage across this switch 34 is 1 vbe, or less than 1 volt. The base current is shown as being supplied by the resistor 31, but could be supplied by some other circuit element. Due to the regenerative action of this circuit, if the load requires a current surge, the additional base drive required for the transistor 13 is provided by the thyristor 12, or by the transistor 42 in FIG. 3. This makes the surge current capabilities of this circuit independent of the initiating current and dependent upon the devices 12, 13, 42, and 43.

FIG. 4 shows a control circuit 11B similar to the control circuit 11 of FIG. 1, with some of the same circuit components bearing the same reference numerals as before. In the control circuit 11B, there is no direct connection from the anode of thyristor 12 to the base of transistor 13; instead, the anode of the thyristor 12 is brought out by a conductor 47 to a second control terminal 48. This switch 34 is connected between the control terminal 16 and the second control terminal 48. The resistor 31 is connected between the first terminal 14 and the second control terminal 48 and a Zener diode 49 is connected between the second control terminal 48 and the second terminal 15. A resistor 50 is connected between the first control terminal 16 and the second terminal 15.

FIG. 4 has an operation such that the open and closed condition of the switch 34 is the reverse of the result obtained in the circuits of FIGS. 1-3. With the switch 34 open, base drive on the transistor 13 is removed and the circuit is in the OFF state. In this condition, the resistor 50 keeps the leakage current of the transistor 13 to a minimum by leading these currents away from the base-emitter junction. When the switch 34 is open, the maximum voltage across it is the voltage of the Zener diode 49, so diode 49 protects the switch from high voltages which may be across terminals 14 and 15.

When the switch 34 closes, this completes the regenerative circuit and supplies base drive to the transistor 13, which turns on this transistor and the thyristor 12 so that the two regenerate into saturation. When the switch 34 opens, base drive is removed and the circuit degenerates to the OFF state.

FIG. 2 shows an additional feature of the invention, in that the electronic control circuit of FIGS. 1, 2, 3, or 4 may be used as a pilot element to drive a larger power device to increase the current-carrying capability of the entire circuit. In FIG. 2, this is illustrated by a load resistor 53 connected between the positive voltage source terminal 54 and the first terminal 14. Also, a power transistor 55 has the output thereof connected between the first terminal 14 and a negative voltage source terminal 56. The second terminal 15 of the circuit 11A is connected to the input of transistor 55, namely, to the base thereof, and a resistor 59 is connected across the input of the power transistor 55, namely, the base-emitter junction. The transistor 55 is a large power transistor, for example, with a gain of 10, and with the switch 34 closed, the high resistance of resistor 31 will not pass enough current to turn on this transistor 55. Thus, this transistor is off, as is the control circuit 11A, or 11 or 41, should such control circuit be used with the power transistor shown in FIG. 2. Opening of the switch 34 turns on the transistor 13 and regeneratively turns on the entire control circuit 11A. The input to the ttansistor 55 may be considered a load for the control circuit 11A so that the turn-on thereof supplies the drive to turn on the transistor 55. Resistor 53 is thus the load resistor for the transistor 55 which amplifies the output from the control circuit 11A. When the switch 34 is closed, the base current drive to transistor 13 is removed and the control circuit 11A is degeneratively turned off. Since resistor 31 cannot supply enough current to drive transistor 55, this transistor also degeneratively is rendered non-conductive. The switch 34 may be connected between the control terminal 16 and the negative terminal 56, rather than as shown, because in either case the switch will be capable of reducing the base-emitter voltage to zero to cause degenerative action. Even a slight negative bias on the base may be desirable in some circuits to achieve turn-off of the transistor 13, and hence of thyristor 12.

FIG. 5 shows a power control circuit 61 which utilizes the electronic control circuit 11 or 41 of FIGS. 1, 2, 3, or 4. This control circuit is shown in the configuration of FIGS. 2 and 3, although it will be clear to the practitioner skiller in the art that the circuit of FIG. 4 could also be used therein. A voltage source 62 is shown, and this may be either an AC source or a DC source. A load 63 is connected in series with the voltage source 62 and in series with terminals 64 and 65 of the power control circuit 61. A rectifier 66 is connected across the terminals 64 and 65, and this may be a center tapped transformer with full wave rectifier, or preferably a bridge rectifier circuit to supply a positive voltage at the first terminal 14 and a negative voltage at the second terminal 15. Also, a movistor 67 is connected across the terminals 64 and 65 to absorb transient voltages.

This power control circuit 61 may be utilized with the switch 34 as a proximity switch, for example. When such switch detects the close presence of an object, the switch opens, and this forces the electronic control circuit 11 or 41 into regenerative action toward conduction for a saturated mode. Thus, effectively, the terminals 64 and 65 are closed to energize the load 63. Also, the close presence of an object could be used to close the proximity switch 34, which would cause the control circuit 11 to degenerate to the OFF condition, and hence de-energize the load 63. In this manner, a power control circuit 61 is achieved which is only a two-terminal circuit of terminals 64 and 65, and can be wired in series with the load 63 and voltage source 62 for complete control of the OFF and ON conditions of this load 63.

Figure 6:
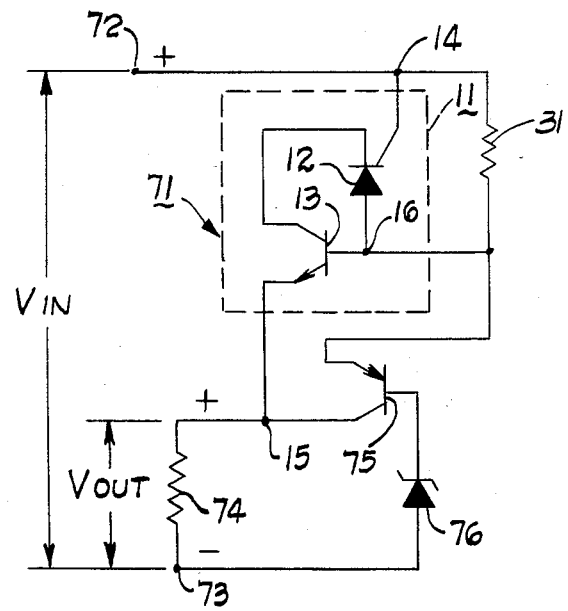
FIG. 6 is a schematic diagram of a regulator circuit embodying the invention.

FIG. 6 illustrates another feature of the invention, wherein the control circuit 11 or 41 may be used in the linear mode as opposed to the saturated mode. FIG. 6 shows a means to achieve feedback on the control terminal 16 so as to continuously balance the regenerative and degenerative actions in a linear mode, in accordance with the fixed or variable control signal applied to control terminal 16. FIG. 6 shows a simple linear voltage regulator circuit 71 which utilizes the electronic control circuit 11 or 41. The DC input voltage is applied at a positive terminal 72 relative to a negative terminal 73. A load resistor 74 is connected between the second terminal 15 and the negative voltage source terminal 73. A PNP transistor 75 has the emitter connected to the control terminal 16 and the collector connected to the second terminal 15. The base of this transistor is connected through a Zener diode 76 to the negative source terminal 73.

In this voltage regulator circuit 71 of FIG. 6, the control circuit 11 is forced to operate in an intermediate range between the OFF condition and the saturated mode. The regenerative circuit of the thyristor 12 and transistor 13, together with the load resistor 74, is forced to operate at a point defined by the Zener diode 76 and transistor 75. If the output voltage across the load resistor 74 tries to increase, then the voltage of the control terminal 16 will also tend to increase because of the generally constant voltage drop across the transistor 75. The Zener diode 76 will keep the base potential constant, and hence the increasing voltage at control terminal 16 tends to turn on the transistor 75, which shunts more base drive around the transistor 13, thus reducing the gain of the regenerative circuit of the thyristor 12 and transistor 13. This means that the electronic control circuit 11 is forced to operate in the linear mode in an intermediate range between the OFF condition and the saturated mode. As a more specific example, assume that the positive voltage terminal is 120 volts and the Zener diode 76 has a voltage of 6.0 volts. The transistor 75 could have a gain of 40, with a vbe of 0.6 volts. The transistor 13 would be a larger power transistor than the transistor 75 and could have a vbe of 0.65 volts, with control terminal 16 established at 6.6 volts and the voltage across the load resistor 74 established at 5.95 volts. The resistor 31 could be 1 megohm resistor and the load resistor at about 1 kiloohm or 60 ohms. This would establish a 100 ma current in load resistor 74, a base drive for the transistor 13 at about 2 ma, and a collector current in transistor 75 of 30 ma, and, with a gain of 40 on the transistor 75 the Zener diode 76 would need to absorb only about 0.8 ma.

If the load decreases, tending to decrease the output voltage on this load resistor 74, the transistor 75 turns more toward the OFF condition and transistor 13 and thyristor 12 turn on to a greater degree, maintaining the output voltage at the set value. The transistor 75 must be able to completely control the base current of the transistor 13. In this type of circuit, the control current through the Zener diode 76 is minimal, and the input voltage can vary widely, e.g., from 10 volts to 400 volts. The transistor 75 and Zener diode 76 are merely representative of one of many types of feedback schemes which could be used. The transistor 75 could be eliminated and the cathode of the Zener diode 76 could go directly to the base of the transistor 13; however, the circuit would waste current through the Zener diode in proportion to the gain of the transistor 13.

In one practical circuit constructed in accordance with FIG. 1, the thyristor utilized was a 2N6240, which was a 4-ampere-rated thyristor. The transistor 13 was an MJE 13007, a power transistor rated at 8 amperes and 400 volts. The resistor 31 was a 1 megohm resistor. During conduction, since the thyristor 12 was conducting from the gate to the cathode, which is generally in a direction opposite to that which it normally would conduct, i.e., from anode to cathode, the thyristor had a maximum current-carrying capacity of about 2 amperes, depending upon the heat dissipation. The transistor 13 has a relatively high gain and handling the 2 amperes at 400 volts results in 800 watts at only about 100 milliamps of base current on the transistor 13.

The circuit of FIG. 3 with the discrete transistors 42 and 43 could be advantageous where certain power transistors can be located and have desired characteristics superior to those of the available thyristors of FIG. 1, for example. In the circuit of FIG. 3, the transistors 43 would be the one carrying the heavy current. If transistor 13 had a gain of 10, for example, then transistor 42 would carry only about one-tenth of the current of transistor 43. For high power circuits, a gain of 5-10 for the transistor 13 would be typical gains, whereas, gains of 40-100 might be more typical for a low power circuit.

The circuit of FIG. 4 is perhaps more usable with a reed switch because such a switch has a low voltage and current rating, yet has a long life and is readily usable with the circuit of FIG. 4 wherein the switch 34 is closed when the control circuit is in the ON condition. On the other hand, the circuits of FIGS. 1, 2, and 3 are perhaps more suitable for a typical proximity switch wherein the switch 34 is to be open when the control circuit is in the ON condition. This control circuit 11 provides a very suitable, two-terminal power control switch, as shown in FIG. 5, to control a load over a wide voltage range, e.g., 5-400 volts.

It has been stated above that the switch 34 may be of many different types, e.g., a transistor. The circuits of FIGS. 1-4 may utilize such a transistor as a switch in a chopper circuit, wherein the transistor is rapidly turned on and off to control the average power, by a varying duty cycle, to a load, such as a motor.

The control circuit 11 accomplishes with very few components the functions of low off-state leakage current, high load currents, and high noise immunity. To accomplish this with Darlington transistors would require several stages and noise filtering, and would be prone to pulling out of saturation on current surges drawn by the load. By the simple addition of the bridge rectifier 66, such as is shown in FIG. 5, the control circuit 11 or 41 may be used with AC or DC voltage sources. If the transistor 13 is operated at low gain, the load current is shared by the base and collector thereof, which means a smaller transistor might be used. The gain characteristics of this circuit are well-suited for a two-terminal circuit, as in FIG. 5, where current to operate power control elements is at a premium. Further, this control circuit 11 can allow an AC switch to turn off faster than one with a thyristor for an output device, since the AC current does not have to go to zero to turn the power section off. This means the response time of an AC switch can be made considerably faster.

The control circuit 11 or 41 combines the advantages of high gain, high current, high voltage, high switching speed, both ON and OFF, high noise immunity, and low holding current, as low as 60 nanoamperes being required, as well as low costs, which are normally mutually exclusive in most control circuits. The control circuit lends itself to both high and low power circuits, either AC or DC. If the control circuit 11 or 41 is operating in a saturated mode, once the base of the NPN transistor 13 is activated, the control circuit will remain in saturation until the load current goes to zero, or the current is removed from the base of the NPN transistor 13, or alternatively the cathode of the thyristor. The base of the NPN transistor is preferred because it takes less current to turn the control circuit on and off, which results in a higher gain circuit. In the linear control mode such as is shown in FIG. 6, the gain is still high and the limiting factor is the power dissipation of the devices chosen. The two control devices will share the power dissipation dependent upon the device gains. Proper control of the NPN transistor 13 will give proper linear control. The control logic must be able to control the base current of the NPN transistor 13. Due to the high current gain and low initiating current, this control circuit 11 or 41 will turn on at very low voltages on AC and DC, 4–5 volts or less. Having two separate devices 12 and 13 and direct access to the base connection of the transistor 13 enables complete control of this circuit compared to a thyristor or gate turn-off device. Use of the thyristor as a low gain PNP, high voltage transistor enables use of a low-cost, readily available power device.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of the circuit and the combination and arrangement of circuit elements may be resorted to without departing from the spirit and the scope of the invention as hereinafter claimed.

What is claimed is:

1. An electronic control circuit comprising in combination:

first and second terminals adapted to be connected respectively to positive and negative DC source terminals;

a control terminal on said control circuit;

an NPN transistor having collector, emitter, and base electrodes;

semiconductor means including at least one structure having a first series of NPN conductivity regions and a second series of PNP conductivity regions;

said P conductivity region of said first series being directly connected to said first-mentioned P conductivity region in said second series and connected to said first terminal;

said second-mentioned N conductivity region in said first series being directly connected to said N conductivity region in said second series;

said first-mentioned N conductivity region in said first series being connected to said collector electrode;

said second-mentioned P conductivity region in said second series being adapted to be connected to said base electrode;

means connecting said emitter electrode to said second terminal; and means connecting said control terminal to said base electrode to control the current thereinto.

2. An electronic control circuit as set forth in claim 1, including switch means connected to said control terminal to control application of a control signal thereto.

3. An electronic control circuit as set forth in claim 1, wherein said semiconductor means is a single thyristor.

4. An electronic control circuit as set forth in claim 1, wherein said semiconductor means is a discrete NPN transistor and a discrete PNP transistor.

5. An electronic control circuit as set forth in claim 1, wherein said means connecting said control terminal to said base electrode is a switch means.

6. An electronic control circuit as set forth in claim 1, including biasing means to bias said control terminal positively relative to said emitter electrode to establish regenerative conduction of said transistor and said semiconductor means.

7. An electronic control circuit as set forth in claim 6, including switch means connected to said control terminal to terminate application of positive bias to said control terminal to establish degeneration toward non-conduction of said transistor and said semiconductor means.

8. An electronic control circuit as set forth in claim 6, including switch means connected between said control and second terminals.

9. An electronic control circuit as set forth in claim 6, including a load impedance connected between said second terminal and the negative DC source terminal and means connecting a Zener diode between said control and negative source terminals.

10. An electronic control circuit as set forth in claim 9, wherein said Zener diode connecting means includes a transistor with an output thereof connected between said control and second terminals and with said Zener diode connected to the input thereof.

11. An electronic control circuit comprising in combination:

first and second terminals adapted to be connected respectively to voltage source terminals;

a thyristor having anode, cathode, and gate electrodes;

an NPN transistor having collector, emitter, and base electrodes;

means connecting said gate electrode to said first terminal;

means connecting said emitter electrode to said second terminal;

means connecting said cathode electrode to said collector electrode;

means connecting said anode electrode to said base electrode to form a regenerative circuit of said thyristor and transistor;

a control terminal; and means connecting said control terminal to said regenerative circuit whereby with current flow through said control terminal, said transistor and thyristor are regeneratively brought toward conduction and whereby upon cessation of current flow through said control terminal, said transistor and thyristor are degeneratively brought toward non-conduction.

12. An electronic control circuit as set forth in claim 11, including means to bias positively said control terminal relative to said second terminal to establish said transistor and thyristor regeneratively toward conduction.

13. An electronic control circuit as set forth in claim 12, wherein said means connecting said control terminal to said regenerative circuit includes switch means connected to said control terminal to alternatively establish said regenerative circuit regeneratively toward conduction and degeneratively toward non-conduction.

14. An electronic control circuit as set forth in claim 13, wherein said switch means is connected between said control and second terminals.

15. An electronic control circuit as set forth in claim 13, wherein said switch means is connected between said anode electrode and said base electrode.

16. An electronic control circuit as set forth in claim 12, including regulator means to control the voltage on said control terminal to balance the regenerative and degenerative conduction at an intermediate range.

17. An electronic control circuit as set forth in claim 12, including feedback means to control the voltage on said control terminal to balance the regenerative and degenerative conduction at an intermediate range.

* * * * *

UNITED STATES PATENT AND TRADEMARK OFFICE
CERTIFICATE OF CORRECTION

PATENT NO. : 4,571,501

DATED : February 18, 1986

INVENTOR(S) : Robert J. Crosby

It is certified that error appears in the above-identified patent and that said Letters Patent are hereby corrected as shown below:

Column 5, line 4, after "41" insert --embodying the invention. This circuit has a number of components the same as shown in FIGS. 1 and 2, with the same reference numerals. In the electronic control circuit 41--

Column 6, line 66, "skiller" should be --skilled--

Signed and Sealed this

Fourth Day of November, 1986

[SEAL]

Attest:

DONALD J. QUIGG

Attesting Officer

Commissioner of Patents and Trademarks